(12) United States Patent
Zhang et al.

(10) Patent No.: US 10,340,364 B2
(45) Date of Patent: Jul. 2, 2019

(54) H-SHAPED VFET WITH INCREASED CURRENT DRIVABILITY

(71) Applicant: International Business Machines Corporation, Armonk, NY (US)

(72) Inventors: Chen Zhang, Guilderland, NY (US); Kangguo Cheng, Schenectady, NY (US); Tenko Yamashita, Schenectady, NY (US); Xin Miao, Guilderland, NY (US); Wenyu Xu, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/812,807

(22) Filed: Nov. 14, 2017

(65) Prior Publication Data

US 2019/0148516 A1    May 16, 2019

(51) Int. Cl.
*H01L 21/28* (2006.01)
*H01L 21/31* (2006.01)
(Continued)

(52) U.S. Cl.
CPC .... *H01L 29/66666* (2013.01); *H01L 21/3081* (2013.01); *H01L 21/3086* (2013.01);
(Continued)

(58) Field of Classification Search
CPC ......... H01L 21/0337; H01L 21/823468; H01L 21/823828; H01L 21/0338; H01L 21/3086;
(Continued)

(56) References Cited

U.S. PATENT DOCUMENTS

| 6,140,687 A | 10/2000 | Shimomura et al. |
| 6,770,534 B2 | 8/2004 | Cho et al. |

(Continued)

FOREIGN PATENT DOCUMENTS

CN    101661934 A    3/2010

OTHER PUBLICATIONS

T. Oishi et al. "Isolation edge effect depending on gate length of MOSFETs with various isolation structures," IEEE Transactions on Electron Devices, vol. 47, No. 4, Apr. 2000, pp. 822-827.
(Continued)

*Primary Examiner* — Caridad Everhart
(74) *Attorney, Agent, or Firm* — Vazken Alexanian; Michael J. Chang, LLC

(57) ABSTRACT

Techniques for increasing Weff VFET devices are provided. In one aspect, a method of forming a fin structure includes: depositing a hardmask onto a substrate; depositing a mandrel material onto the hardmask; patterning the mandrel material along a first direction to form first mandrels; forming first spacers alongside the first mandrels; forming second mandrels in between the first mandrels; pattering the first/second mandrels along a second direction perpendicular to the first direction; forming second spacers, perpendicular to the first spacers, alongside the first/second mandrels; selectively removing the first/second mandrels leaving behind a ladder-shaped pattern formed by the first/second spacers; transferring the ladder-shaped pattern to the hardmask and then to the substrate. A method of forming a VFET device, a VFET fin structure, and a VFET device are also provided.

20 Claims, 21 Drawing Sheets

(51) Int. Cl.
  *H01L 29/40*    (2006.01)
  *H01L 45/00*    (2006.01)
  *H01L 21/311*   (2006.01)
  *H01L 29/66*    (2006.01)
  *H01L 29/10*    (2006.01)
  *H01L 29/06*    (2006.01)
  *H01L 21/308*   (2006.01)
  *H01L 29/78*    (2006.01)

(52) U.S. Cl.
  CPC ...... *H01L 29/0657* (2013.01); *H01L 29/1037* (2013.01); *H01L 29/7827* (2013.01); *H01L 21/31116* (2013.01)

(58) Field of Classification Search
  CPC .............. H01L 29/6666; H01L 29/0657; H01L 21/823487; H01L 21/32139; H01L 21/308; H01L 29/7827; H01L 29/66666; H01L 29/78642; H01L 29/6656; H01L 29/6653; H01L 29/66545
  See application file for complete search history.

(56) References Cited

U.S. PATENT DOCUMENTS

| | | | |
|---|---|---|---|
| 7,163,851 B2 | 1/2007 | Abadeer et al. | |
| 7,244,549 B2 | 7/2007 | Iwasawa et al. | |
| 7,303,855 B2 | 12/2007 | Hatakeyama et al. | |
| 7,358,025 B2 | 4/2008 | Hatakeyama | |
| 7,683,428 B2 | 3/2010 | Chidambarrao et al. | |
| 8,153,493 B2 | 4/2012 | Lee | |
| 8,742,491 B2 | 6/2014 | Lee | |
| 9,224,837 B2 | 12/2015 | Anderson et al. | |
| 9,299,835 B1 | 3/2016 | Anderson et al. | |
| 9,768,303 B2 | 9/2017 | Lin et al. | |
| 2006/0261406 A1 | 11/2006 | Chen | |
| 2007/0048674 A1* | 3/2007 | Wells | H01L 27/101 430/313 |
| 2010/0052059 A1 | 3/2010 | Lee | |
| 2012/0126329 A1 | 5/2012 | Lee | |
| 2014/0346603 A1 | 11/2014 | Toh et al. | |
| 2017/0033108 A1* | 2/2017 | Masuoka | H01L 29/7827 |
| 2017/0092506 A1* | 3/2017 | deVilliers | H01L 21/0337 |
| 2017/0213912 A1 | 7/2017 | Lin et al. | |

OTHER PUBLICATIONS

D. Gogl et al., "A 1-Kbit EEPROM in SIMOX technology for high-temperature applications up to 250°C," IEEE Journal of Solid-State Circuits, vol. 35, No. 10, Oct. 2000, pp. 1387-1395.

P. Gupta et al., "Shaping gate channels for improved devices," Proc. of SPIE, vol. 6925, 2008, 69250I (8 pages).

\* cited by examiner

TOP-DOWN

TOP-DOWN

TOP-DOWN

TOP-DOWN

TOP-DOWN

TOP-DOWN

CROSS-SECTION A-A'

TOP-DOWN

CROSS-SECTION B-B'

CROSS-SECTION C-C'

CROSS-SECTION B-B'

CROSS-SECTION C-C'

CROSS-SECTION B-B'

CROSS-SECTION C-C'

US 10,340,364 B2

H-SHAPED VFET WITH INCREASED CURRENT DRIVABILITY

FIELD OF THE INVENTION

The present invention relates to vertical field effect transistor (VFET) devices, and more particularly, to techniques for increasing effective channel width Weff in VFET devices without increasing cell area, and thereby enhancing current drivability.

BACKGROUND OF THE INVENTION

As opposed to planar complementary metal oxide semiconductor (CMOS) devices, vertical field effect transistors (VFETs) are oriented with a vertical fin channel disposed on a bottom source and drain, and a top source and drain disposed on the fin channel. VFETs are being explored as a viable device option for continued CMOS scaling beyond the 7 nanometer (nm) technology node.

However, there are some notable challenges associated with scaled designs. For instance, as feature sizes shrink the current drivability of the device can become degraded, negatively impacting device speed and overall performance.

Therefore, techniques for enhancing current drivability in VFET designs would be desirable.

SUMMARY OF THE INVENTION

The present invention provides techniques for increasing effective channel width Weff in vertical field effect transistor (VFET) devices, without increasing cell area, and thereby enhancing current drivability. In one aspect of the invention, a method of forming a fin structure for a VFET is provided. The method includes: depositing a hardmask onto a substrate; depositing a mandrel material onto the hardmask; patterning the mandrel material along a first direction to form first mandrels; forming first spacers alongside the first mandrels; filling gaps between the first mandrels with additional mandrel material to form second mandrels in between the first mandrels; patterning the first mandrels, the first spacers and the second mandrels along a second direction, wherein the second direction is perpendicular to the first direction; forming second spacers, perpendicular to the first spacers, alongside the first mandrels and the second mandrels; selectively removing the first mandrels and the second mandrels leaving behind a ladder-shaped pattern formed by the first spacers and the second spacers; transferring the ladder-shaped pattern to the hardmask; and transferring the ladder-shaped pattern from the hardmask to the substrate to form a first fin adjacent to a second fin, and at least one cross fin interconnecting the first fin and the second fin.

In another aspect of the invention, a method of forming a VFET device is provided. The method includes: forming a fin structure in a substrate, the fin structure including a first fin adjacent to a second fin, and at least one cross fin interconnecting the first fin and the second fin; forming bottom source and drains in the substrate beneath the fin structure; forming bottom spacers on the bottom source and drains; forming a gate around the fin structure over the bottom spacers; forming top spacers above the gate; and forming top source and drains at a top of the fin structure.

In yet another aspect of the invention, a VFET fin structure is provided. The VFET fin structure includes: a first fin adjacent to a second fin; and at least one cross fin interconnecting the first fin and the second fin.

In still yet another aspect of the invention, a VFET device is provided. The VFET device includes: a fin structure patterned in a substrate, the fin structure including a first fin adjacent to a second fin, and at least one cross fin interconnecting the first fin and the second fin; bottom source and drains in the substrate beneath the fin structure; bottom spacers disposed on the bottom source and drains; a gate surrounding the fin structure over the bottom spacers; top spacers disposed above the gate; and top source and drains at a top of the fin structure.

A more complete understanding of the present invention, as well as further features and advantages of the present invention, will be obtained by reference to the following detailed description and drawings.

DETAILED DESCRIPTION OF PREFERRED EMBODIMENTS

Provided herein are improved vertical field effect transistor (VFET) device designs and techniques for fabrication thereof whereby an effective channel width Weff of the device is increased (as compared to conventional VFET devices) but, advantageously, without a tradeoff in terms of increased cell area. Increasing Weff can enhance the current drivability and thus overall performance of the device.

As will become apparent from the following description, the bases for the VFET devices are patterned fins that serve as a vertical fin channel between bottom and top source and drains. Advantageously, according to the present techniques, adjacent fins are connected to one another thereby increasing the Weff. However, the (interconnected) fins have the same overall footprint as two adjacent (unconnected) fins, and therefore the gain in Weff is realized without any increase in the cell area.

By way of example only, one fin configuration contemplated herein is an H-shaped fin structure. See for example FIG. 1 which compares (via top-down views) a design having two individual, unconnected fins 102 (on the left) and the present design having two fins 104 interconnected in an H-shaped manner (on the right). The fins 104 are interconnected by a cross fin 106 that is oriented orthogonal to the fins 104 and interconnects the fins 104 at their center such that when viewed from the top down, the fins 104/cross fin 106 has an H-shape.

To illustrate the increase in Weff by the present design, assume for instance that the fins 102 and 104 all have the same dimensions and configuration, e.g., a length of 45 nanometers (nm), a thickness D of 6 nm, and a fin pitch FP of 40 nm. Fin pitch is simply the distance between a given point on one fin and the same point on the adjacent fin. Assume also that the cross fin 106 too has a thickness D of 6 nm. With fins 102, the Weff=(45+6)×4=204 nm. By comparison, adding the cross fin gives the fins 104/cross fin 106 a Weff=(45+6)×4−6×2+(40−6)×2=260 nm. Thus, an increase in Weff of 56 nm with identical shaped/spaced fins 102 and 104 can be realized simply by interconnecting the fins 104 with a cross fin 106.

Figure 2:
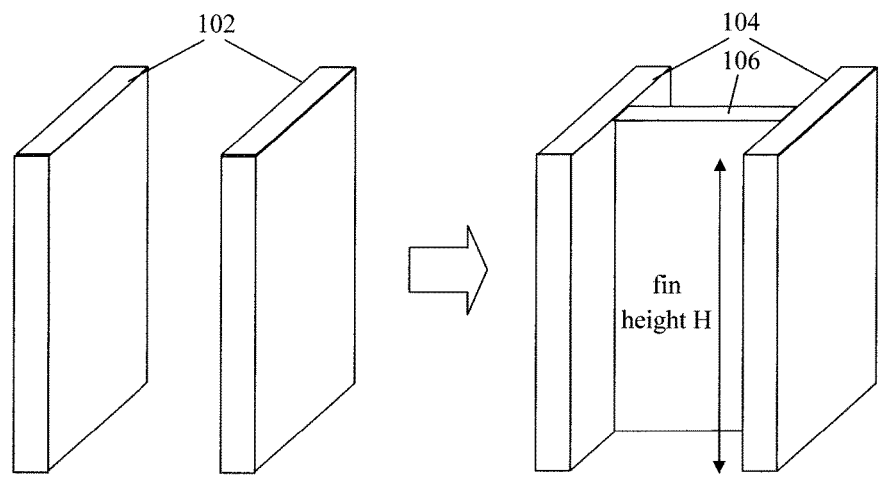
FIG. 2 is a three-dimensional diagram illustrating the (unconnected) fins and (interconnected) fins according to an embodiment of the present invention.

FIG. 2 is a three-dimensional depiction of the (unconnected) fins 102 and (interconnected) fins 104. FIG. 2 illustrates how in the present design the fins 104 are interconnected by the cross fin 106 that is oriented orthogonal to the fins 104 and which runs the full height H of the fins 104 (see fin height H).

It is notable that an H-shaped configuration is only one structure contemplated herein for VFET interconnected fins. In general, the present techniques are directed to fin structure designs wherein adjacent fins (e.g., a first fin and a second fin) such as fins 104 are interconnected by at least one cross fin such as cross fin 106.

Figure 3:
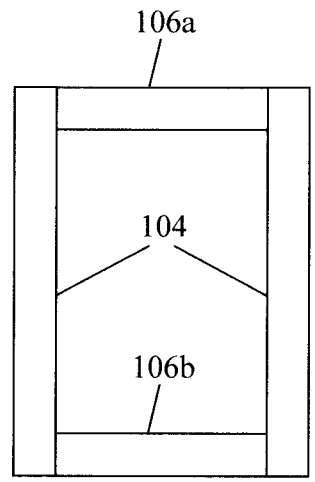
FIG. 3 is a top-down diagram illustrating the present fin design having two fins interconnected by cross fins in an O-shaped manner according to an embodiment of the present invention.

For instance, according to another exemplary embodiment the adjacent fins 104 are interconnected by multiple cross fins (e.g., a first cross fin 106a and a second cross fin 106b). See, for example, FIG. 3 which provides a top-down view of the interconnected fins 104. As shown in FIG. 3, two cross fins 106a and 106b are used to interconnect the fins 104. One cross fin 106a interconnects one end of the fins 104, and the other cross fin 106b interconnects the other (opposite) end of the fins 104. From the top-down depiction it can be seen that this alternative cross fin configuration can have an O-shaped design, as opposed to the H-shaped design presented above.

Figure 4:
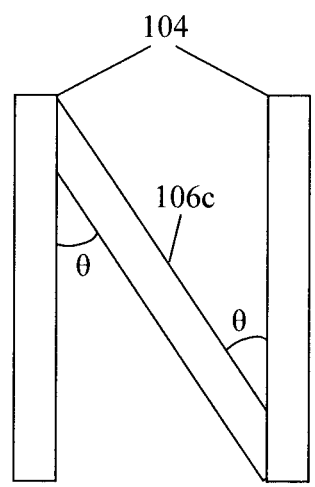
FIG. 4 is a top-down diagram illustrating the present fin design having two fins interconnected by a cross fin in an N-shaped manner according to an embodiment of the present invention.

The fins 104 and cross fin(s) 106(a,b) do not have to be orthogonal to one another. For instance, as shown in FIG. 4 a cross fin 106c is oriented at an angle θ relative to the fins 104, wherein θ<90°. From the top-down depiction it can be seen that this alternative cross fin configuration can have an N-shaped design, as opposed to the H-shaped design presented above.

As will be described in detail below, the present fin/cross fin designs can be patterned in a substrate using a direct patterning process and/or sidewall image transfer (SIT) techniques. In general, a SIT process involves patterning mandrels on a substrate, and then using the mandrels to place spacers (alongside the mandrels). Selective removal of the mandrels leaves behind the spacers that are then used for fin patterning. SIT is a pitch doubling process in that each mandrel patterned results in the placement of two spacers. One notable advantage of an SIT process is that it permits the patterning of fins at a sub-lithographic pitch, i.e., beyond the resolution of a direct patterning process, since each (lithographically-defined) mandrel results in the placement of multiple (i.e., two) spacers for the fin etch. It is also notable that the SIT approach provided herein is preferable for forming the orthogonal cross fin designs such as the H-shaped (FIG. 1) and O-shaped (FIG. 3) designs, whereas a direct patterning approach is best suited for the angled cross fin designs such as the N-shaped (FIG. 4) design. Thus, both approaches (direct patterning and SIT) are contemplated herein for patterning the present fin designs.

Figure 5:
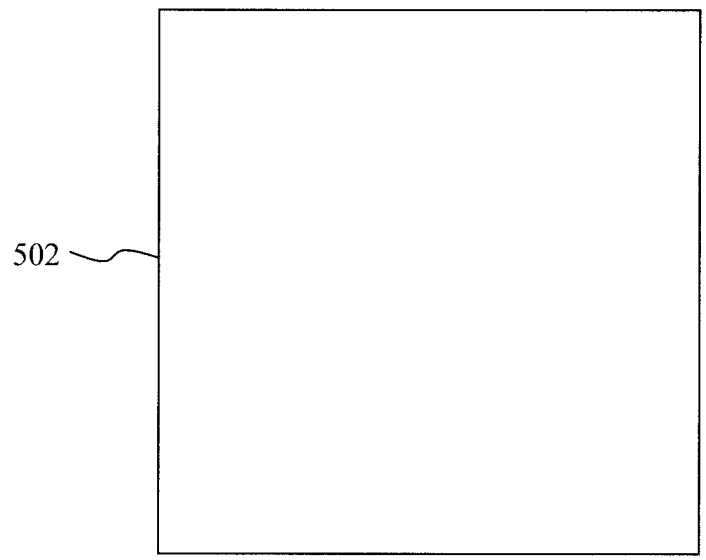
FIG. 5 is a top-down diagram illustrating a starting substrate according to an embodiment of the present invention.

According to an exemplary embodiment, FIGS. 5-19 are diagrams illustrating an exemplary SIT approach for patterning the present fin designs. Beginning with FIG. 5, a top-down diagram of a substrate 502 is shown. It is the substrate 502 in which the fins 104 and cross fins 106 will be patterned to form the vertical fin channels of the present VFET devices.

According to an exemplary embodiment, substrate 502 is an undoped semiconductor wafer, such as a bulk silicon (Si), germanium (Ge) or silicon germanium (SiGe) wafer, or a silicon-on-insulator (SOI) wafer. In general, an SOI wafer includes an SOI layer separated from an underlying substrate by a buried insulator. When the buried insulator is an oxide it is also referred to herein as a buried oxide or BOX.

Figure 6:
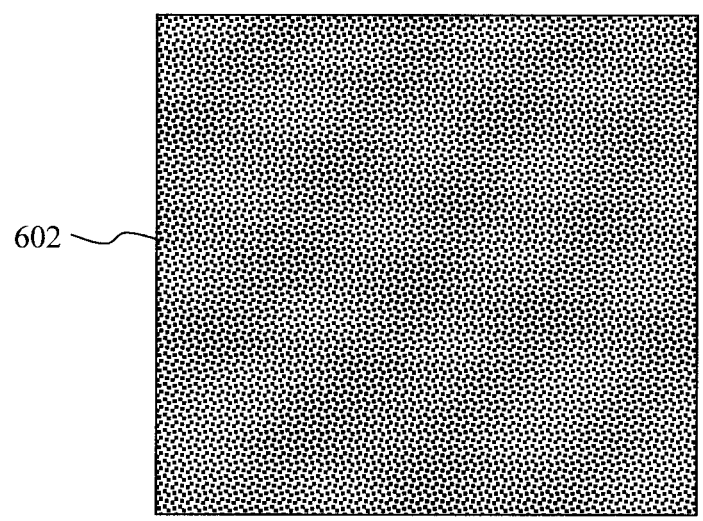
FIG. 6 is a top-down diagram illustrating a hardmask having been deposited onto the substrate according to an embodiment of the present invention.
Figure 7:
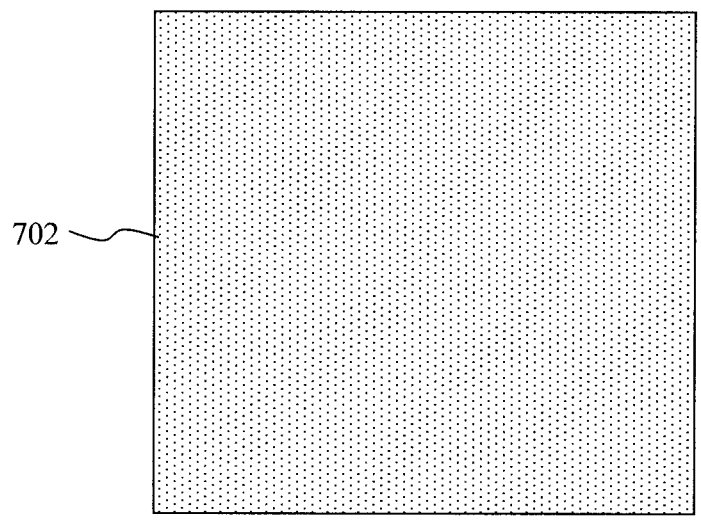
FIG. 7 is a top-down diagram illustrating a mandrel material having been deposited onto the hardmask according to an embodiment of the present invention.

As shown in FIG. 6, a hardmask 602 is next deposited onto the substrate 502. Suitable hardmask materials include, but are not limited to, nitride hardmask materials such as silicon nitride (SiN). SiN can be deposited using a process such as chemical vapor deposition (CVD). As will become apparent from the description that follows, the hardmask 602 will act as an etch stop during mandrel formation.

A mandrel material 702 is then deposited onto the hardmask 602. See FIG. 7. Suitable mandrel materials 702 include, but are not limited to, amorphous silicon (Si) and/or amorphous carbon. Amorphous Si can be deposited, for example, using a physical or chemical vapor deposition process. Amorphous carbon can be deposited, for example, using DC magnetron sputtering.

Figure 8:
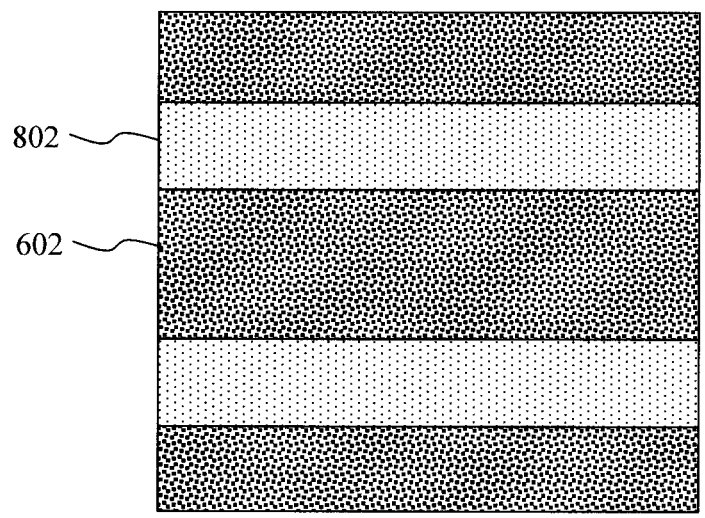
FIG. 8 is a top-down diagram illustrating the mandrel material having been patterned along a first direction to form first mandrels according to an embodiment of the present invention.

The mandrel material 702 is then patterned along a first direction (along the x-direction in this example) to form individual (first) mandrels 802. See FIG. 8. Standard lithography and etching techniques may be employed to pattern the mandrels. Preferably, an anisotropic etching process such as reactive ion etching (RIE) is used. As shown in FIG. 8, the hardmask 602 (now visible in between the mandrels 802) serves as an etch stop during the mandrel etch.

Figure 9:
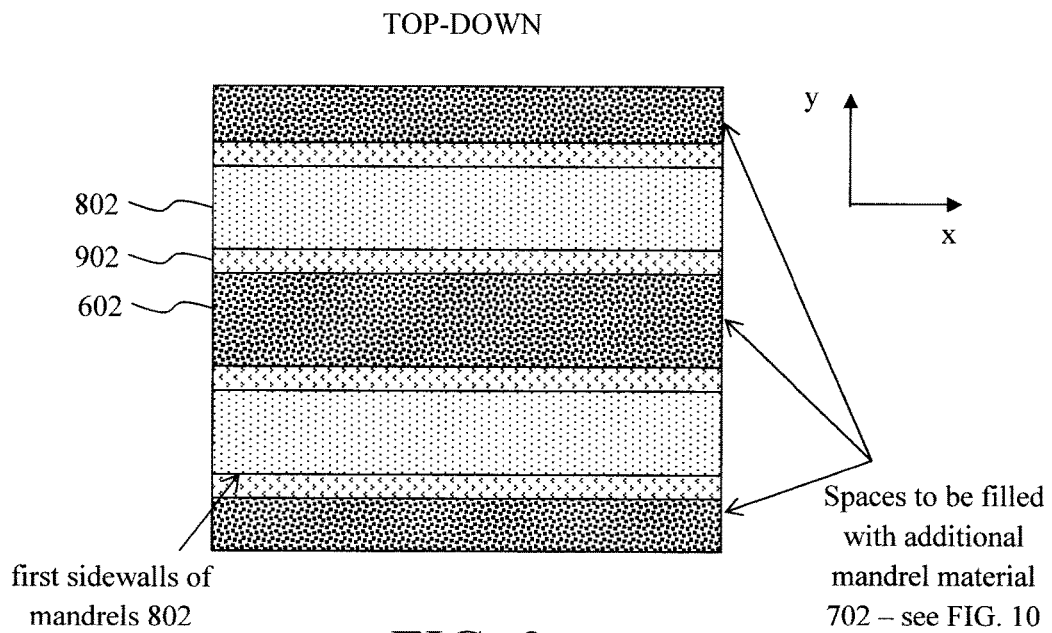
FIG. 9 is a top-down diagram illustrating (first) spacers having been formed alongside sidewalls of the first mandrels according to an embodiment of the present invention.

As shown in FIG. 9, (first) spacers 902 are then formed alongside (first) sidewalls of the mandrels 802. Preferably, the spacers 902 are formed from a material that provides etch selectivity vis-à-vis the mandrels 802. Namely, as will be described in detail below, in order to form the desired fin pattern, the mandrels will need to be removed selective to the spacers. As provided above, the mandrels 802 can be formed from amorphous Si and/or amorphous carbon. In that case, suitable spacer 902 materials include, but are not limited to, silicon dioxide ($SiO_2$).

Spacers 902 can be formed by first blanket depositing a suitable spacer material (e.g., $SiO_2$), and then using standard lithography and etching techniques to pattern the spacer material into the individual spacers 902 on opposite sides of the first sidewalls of the mandrels 802. By way of example only, $SiO_2$ can be deposited using CVD, and then patterned using an oxide-selective etch, such as an oxide-selective RIE.

Figure 10:
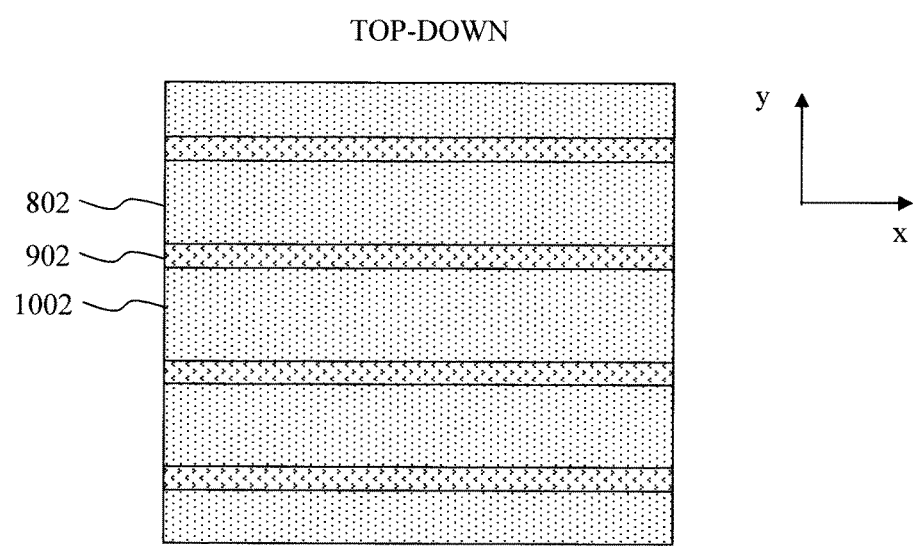
FIG. 10 is a top-down diagram illustrating additional mandrel material having been deposited onto the substrate, filling in gaps between the first mandrels, forming second mandrels in between the first mandrels according to an embodiment of the present invention.

Additional mandrel material 702 is then deposited onto the substrate 502, filling in gaps between adjacent spacer 902/mandrel 802/spacer 902 structures (over the exposed hardmask 602) forming (second) mandrels 1002 in between the (first) mandrels 802. See FIG. 10. As provided above, suitable mandrel materials 702 include, but are not limited to amorphous Si and amorphous carbon. Excess mandrel material 702 is then removed, e.g., using a process such as chemical-mechanical polishing (CMP). As shown in FIG. 10, the result is an alternating spacer 902/mandrel 802/spacer 902/mandrel 1002/spacer 902 structure. This process of patterning the (first) mandrels 802 (as in FIG. 8), forming spacers 902 (as in FIG. 9), and then filling in gaps between the spacers 902 with additional mandrel material 702 to from (second) mandrels 1002 (as in FIG. 10) is done to enable (second) spacers (see below) to be formed in the y-direction as well, perpendicular to the spacers 902, which will be used in patterning the present unique fin designs.

Figure 11:
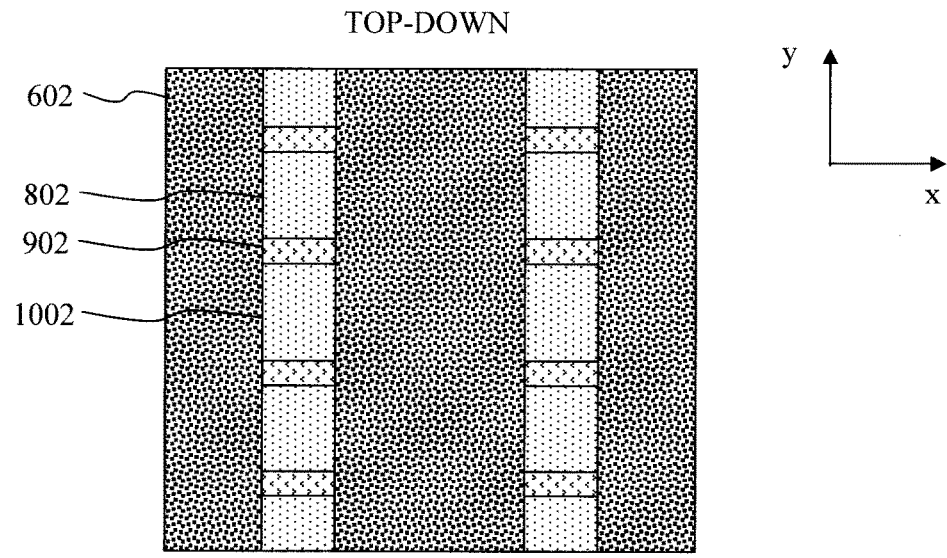
FIG. 11 is a top-down diagram illustrating the first mandrels, second mandrels, and first spacers having been patterned along a second direction perpendicular to the first direction according to an embodiment of the present invention.

Namely, as shown in FIG. 11 the (first) mandrels 802, (second) mandrels 1002, and (first) spacers 902 are next patterned along a second direction (along the y-direction in this example) perpendicular to the first direction (the x-direction in this example). Standard lithography and etching techniques may be employed to pattern the mandrels 802, mandrels 1002 and spacers 902. Preferably, an anisotropic etching process such as RIE is used. As shown in FIG. 11, the underlying hardmask 602 (again visible in between the mandrels 802/1002) serves as an etch stop during this mandrel etch.

Figure 12:
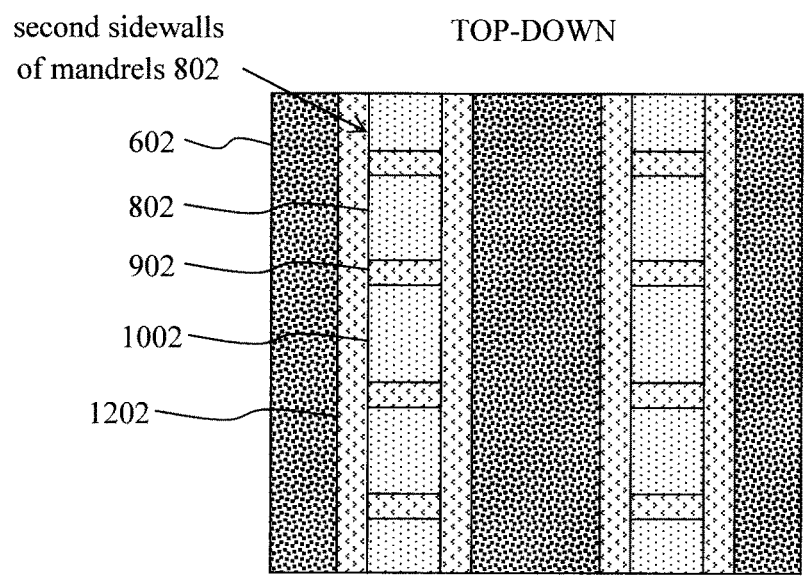
FIG. 12 is a top-down diagram illustrating second spacers having been formed alongside sidewalls of the first mandrels and second mandrels perpendicular to the first spacers according to an embodiment of the present invention.

(Second) spacers 1202 are then formed alongside second sidewalls of the (first) mandrels 802 and (second) mandrels 1002 perpendicular to the (first) spacers 902. See FIG. 12. As shown in FIG. 12, the second sidewalls of the mandrels 802 are perpendicular to the first sidewalls of the mandrels 802. For instance, in the present example, the first sidewalls of the mandrels 802 are along the x-direction, and the second sidewalls of the mandrels 802 are along the y-direction. Compare, for example, FIG. 9 and FIG. 12.

As above, the spacers 1202 are formed from a material (such as $SiO_2$) that provides etch selectivity vis-à-vis the mandrels 802/1002. According to an exemplary embodiment, spacers 1202 are formed from the same material as spacers 902. Spacers 1202 can be formed by first blanket depositing a suitable spacer material (e.g., $SiO_2$), and then using standard lithography and etching techniques to pattern the spacer material into the individual spacers 1202 on opposite sides of the second sidewalls of the mandrels 802. By way of example only, $SiO_2$ can be deposited using CVD, and then patterned using an oxide-selective etch, such as an oxide-selective RIE.

Figure 13:
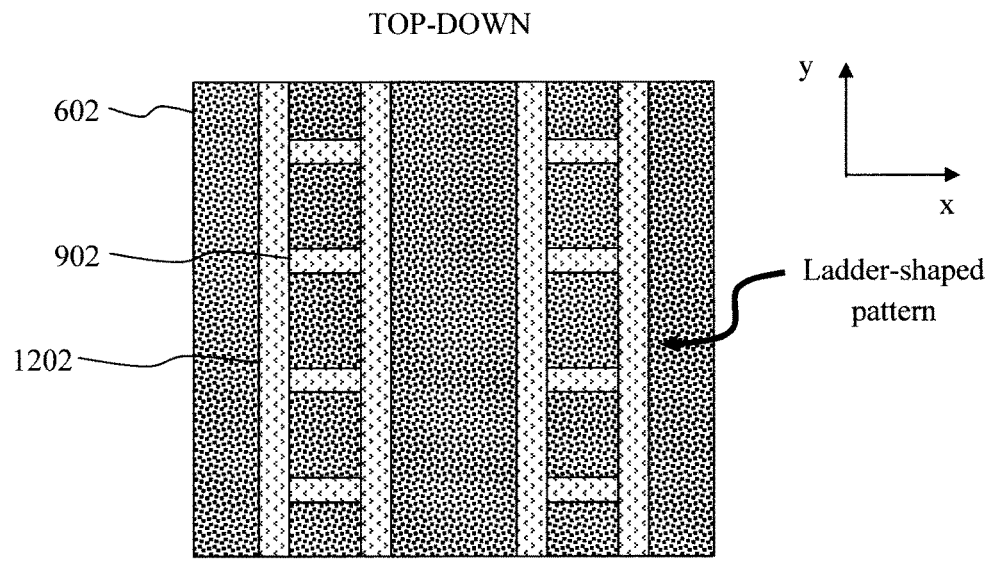
FIG. 13 is a top-down diagram illustrating the first and second mandrels having been removed selective to the first and second spacers leaving behind a ladder-shaped pattern in the first and second spacers according to an embodiment of the present invention.

As shown in FIG. 12, the (first) mandrels 802 and (second) mandrels 1002 have been used to place (first) spacers 902 and (second) spacers 1202 in a 'ladder-shaped' pattern over the substrate 502. The spacers 902 and 1202 will be used to pattern the underlying hardmask 602, which in turn will be used to pattern fins in the substrate 502. Thus, as shown in FIG. 13, the mandrels 802 and 1002 are next removed selective to the spacers 902 and 1202 leaving behind the ladder-shaped pattern.

Figure 14:
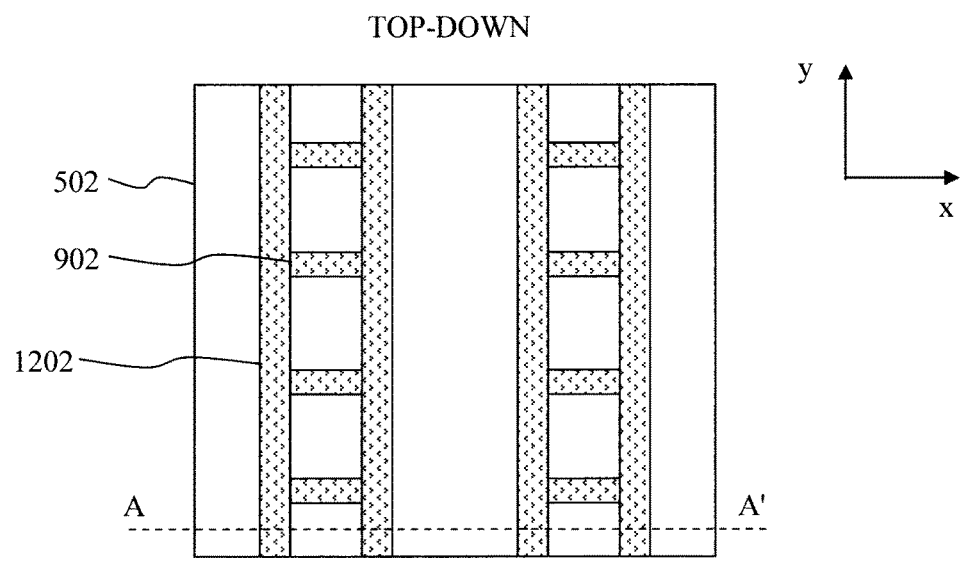
FIG. 14 is a top-down diagram illustrating the ladder-shaped pattern from the first and second spacers having been transferred to the underlying hardmask, and then to the substrate according to an embodiment of the present invention.

As shown in FIG. 14, the ladder-shaped pattern from the spacers 902 and 1202 is then transferred to the underlying hardmask 602. The patterned hardmask is now given the reference numeral 602a. Since the patterned hardmask 602a has the same ladder-pattern as the overlying spacers 902 and 1202, the patterned hardmask 602a is no longer visible in this top-down depiction of FIG. 14. However, the patterned hardmask 602a will be visible once the spacers 902 and 1202 are removed (see, e.g., FIG. 15—described below).

Figure 14A:
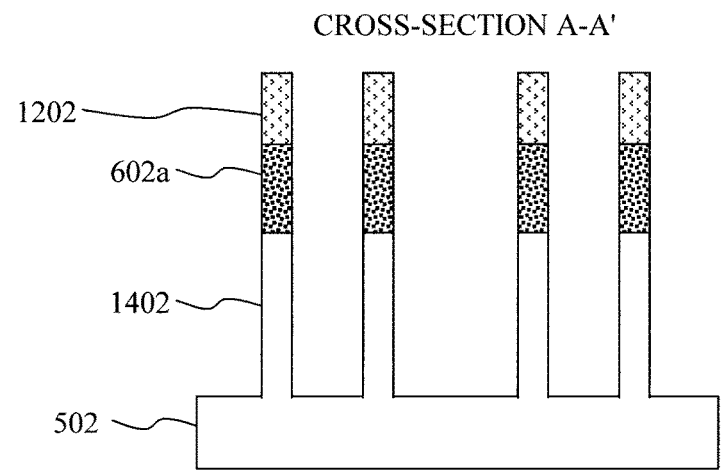
FIG. 14A is a cross-sectional diagram illustrating the ladder-shaped pattern from the first and second spacers having been transferred to the underlying hardmask, and then to the substrate according to an embodiment of the present invention.

The ladder-shaped pattern from the patterned hardmask 602a is then transferred to the underlying substrate 502 so as to form fins 1402 in the substrate 502. In order to depict the fins 1402 patterned below the patterned hardmask 602a, a cross-sectional view through A-A' (see FIG. 14) is shown in FIG. 14A. As shown in FIG. 14A, the fins extend only partway through the substrate 502. As such, the remaining substrate 502 (below the patterned fins 1402) remains visible below the ladder pattern in FIG. 14.

A series of RIE steps may be needed to pattern the hardmask 602a and the fins 1402. For instance, according to an exemplary embodiment, the substrate 502 is an Si wafer and the hardmask 602a is a nitride hardmask (e.g., SiN). In that case, a nitride-selective RIE is used to transfer the ladder-shaped pattern from the spacers 902 and 1202 to the hardmask 602a, while a Si-selective RIE is used to pattern the fins 1402 in the substrate 502.

Figure 15:
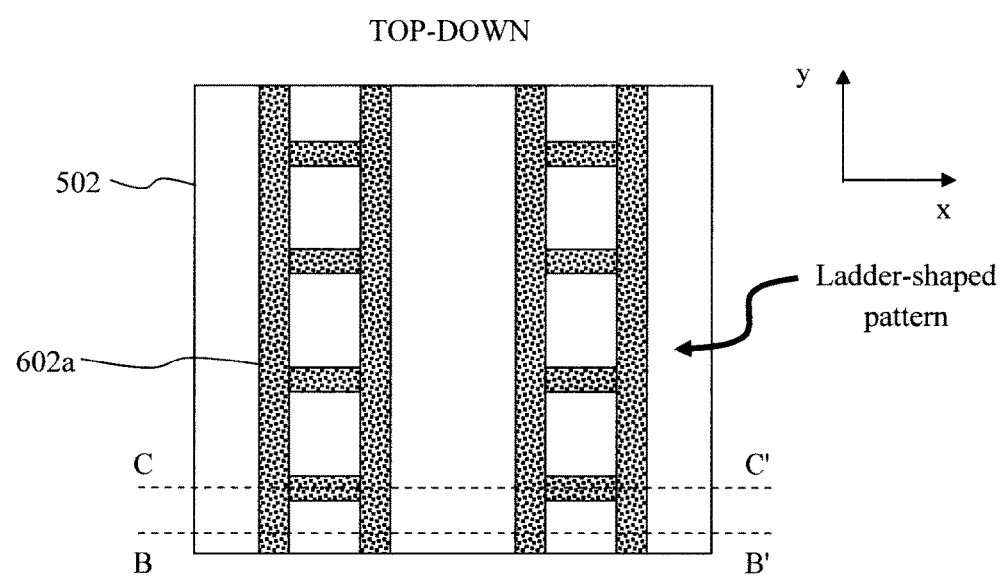
FIG. 15 is a top-down diagram illustrating the first and second spacers having been removed according to an embodiment of the present invention.

Following patterning of the fins 1402, the spacers 902 and 1202 are removed. See FIG. 15. According to an exemplary embodiment, the spacers 902 and 1202 are formed from an oxide spacers material (e.g., $SiO_2$) and the spacers 902 and 1202 are removed using an oxide-selective isotropic etching process, such as an oxide-selective wet etch. With the spacers 902 and 1202 removed, the patterned hardmask 602a is now visible. As shown in FIG. 15, the patterned hardmask 602a has the same ladder-shaped pattern as the spacers 902 and 1202.

In order to form the present fin structures having two adjacent fins 104 and at least one cross fin 106 (a,b), the fins 1402 are next cut into individual, isolated fin structures. The manner in which the cuts are made through the fins 1402 can be used to create vertical fin channels of different shapes.

Figure 1:
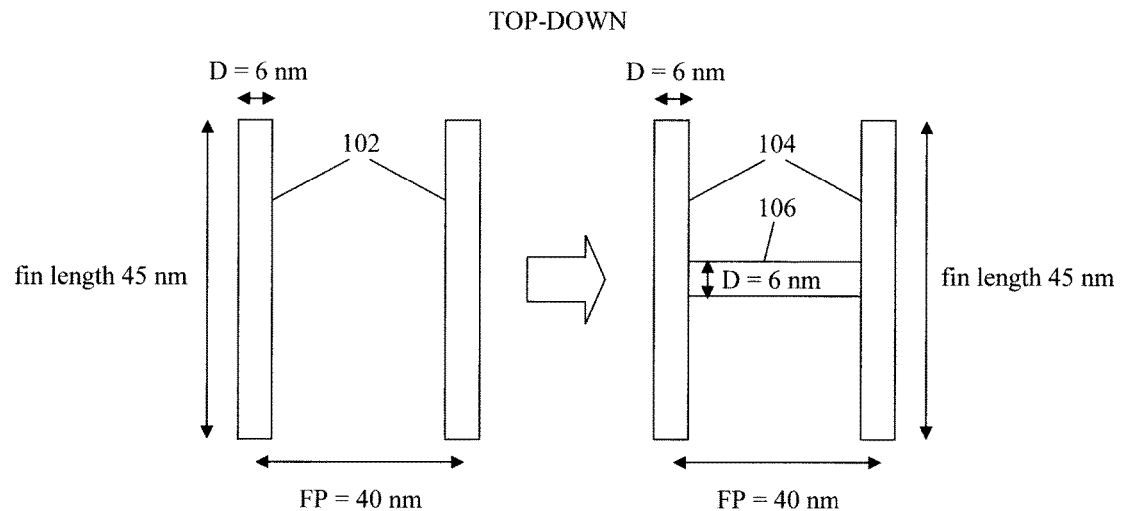
FIG. 1 is a top-down diagram comparing a design having two individual, unconnected fins and the present fin design having two fins interconnected by a cross fin in an H-shaped manner according to an embodiment of the present invention.
Figure 16:
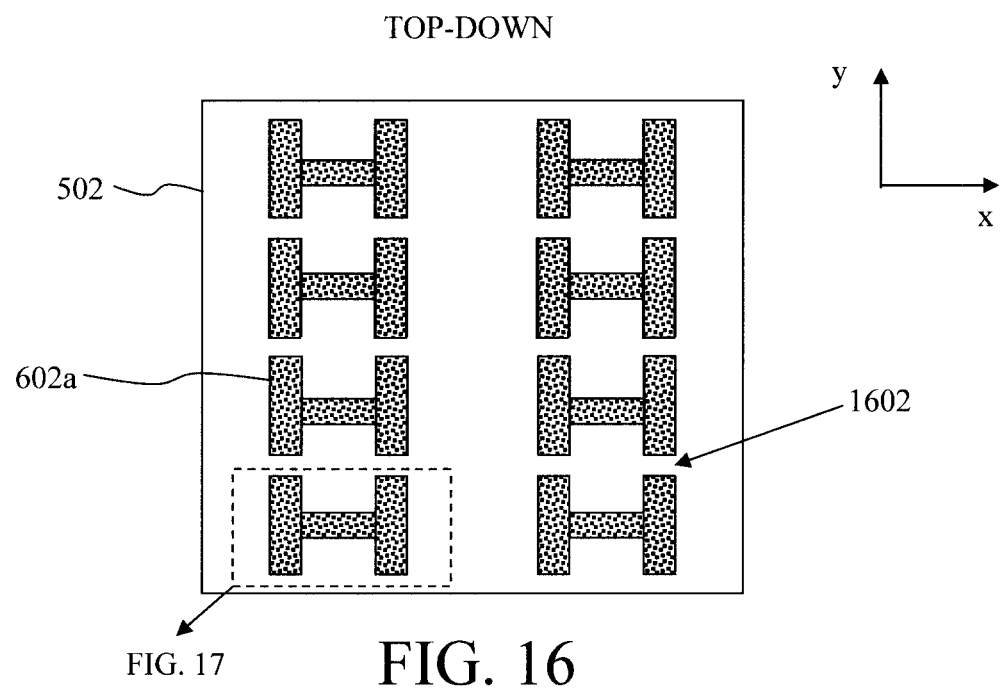
FIG. 16 is a top-down diagram illustrating cuts having been made to the ladder-shaped pattern to form the present fin design having two fins interconnected by a cross fin in an H-shaped manner according to an embodiment of the present invention.
Figure 17:
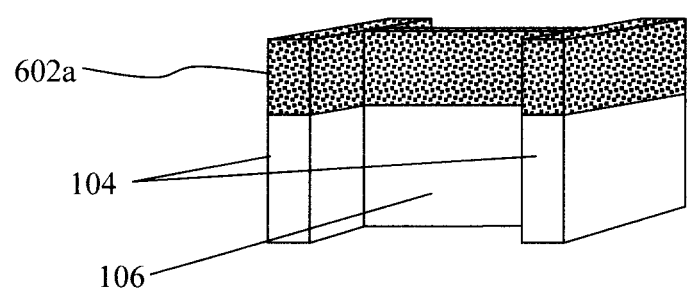
FIG. 17 is a three-dimensional diagram illustrating the present fin design having two fins interconnected by a cross fin in an H-shaped manner according to an embodiment of the present invention.

For instance, FIG. 16 illustrates the cuts needed to make an H-shaped design (as described, for example, in conjunction with the description of FIG. 1, above). Namely, as shown in FIG. 16 cuts 1602 are made in between each "rung" of the ladder-shaped pattern. Thus, as shown in FIG. 17 (a three-dimensional depiction) each isolated vertical fin channel will have two adjacent fins 104 and a cross fin 106 in an H-shaped design.

Figure 18:
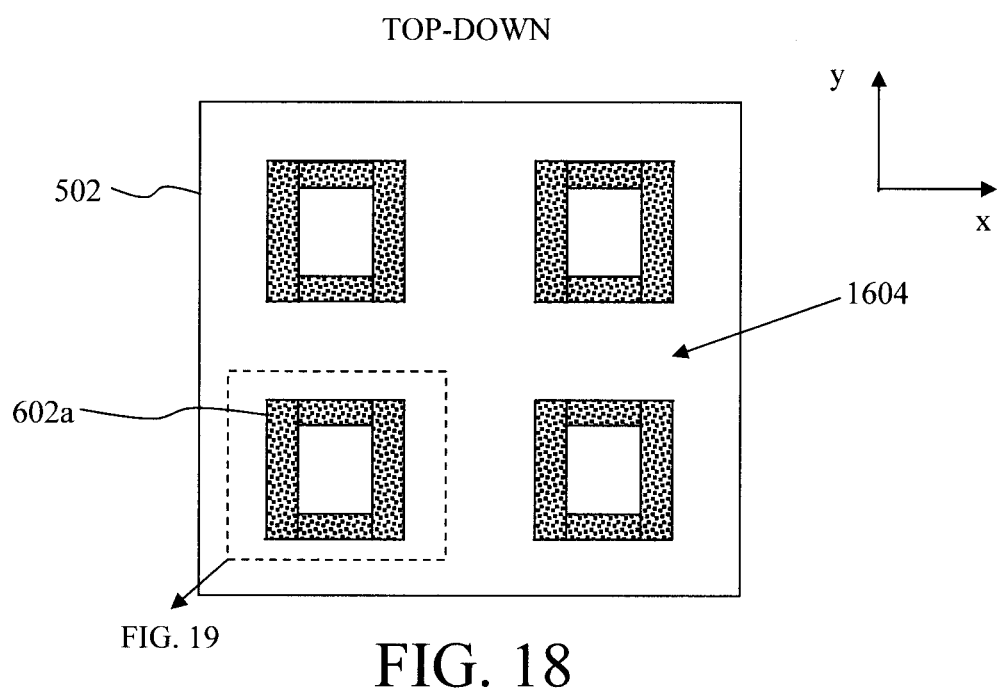
FIG. 18 is a top-down diagram illustrating cuts having been made to the ladder-shaped pattern to form the present fin design having two fins interconnected by cross fins in an O-shaped manner according to an embodiment of the present invention.
Figure 19:
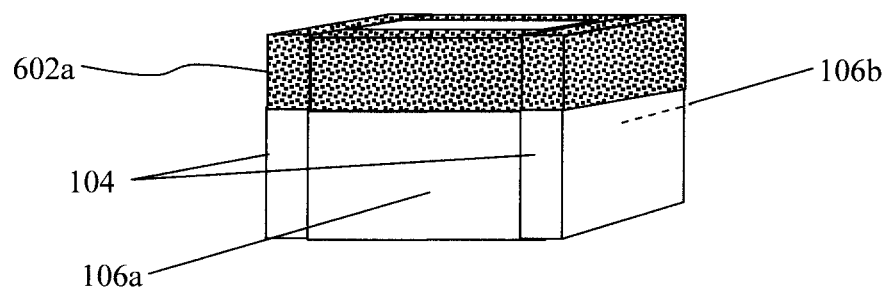
FIG. 19 is a three-dimensional diagram illustrating the present fin design having two fins interconnected by cross fins in an O-shaped manner according to an embodiment of the present invention.

Locating the cuts differently can however result in a different fin design. See, for example, FIG. 18 which illustrates the cuts needed to make an O-shaped design (as described, for example, in conjunction with the description of FIG. 3, above). Namely, as shown in FIG. 18 cuts 1604 are made between every other rung of the ladder shaped pattern. Thus, as shown in FIG. 19 (a three-dimensional depiction) each isolated vertical fin channel will have two adjacent fins 104 and two cross fins 106a and 106b in an O-shaped design. As provided above, a direct patterning approach (rather than SIT) is best suited for forming the N-shaped design (as described, for example, in conjunction with the description of FIG. 4, above).

The (H-shaped, O-shaped, N-shaped, etc.) fin design created can then serve as the basis for forming a VFET device. An exemplary methodology for forming a VFET device starting with the present fin designs is now described by way of reference to FIGS. 20-30. In general, the starting fin structure formed as described above has two adjacent fins 104 and at least one cross fins 106 (a,b). The process will be illustrated using cross-sectional views through the fins 104 (B-B') and through the cross fin 106 (C-C'). See, for example, FIG. 15. It is assumed that cuts have been made (as described above) to create the present fin designs, and the views depicted would appear the same regardless of whether the fins 104 and cross fin 106 shown are part of the H-shaped, O-shaped, etc. design.

Figure 20A:
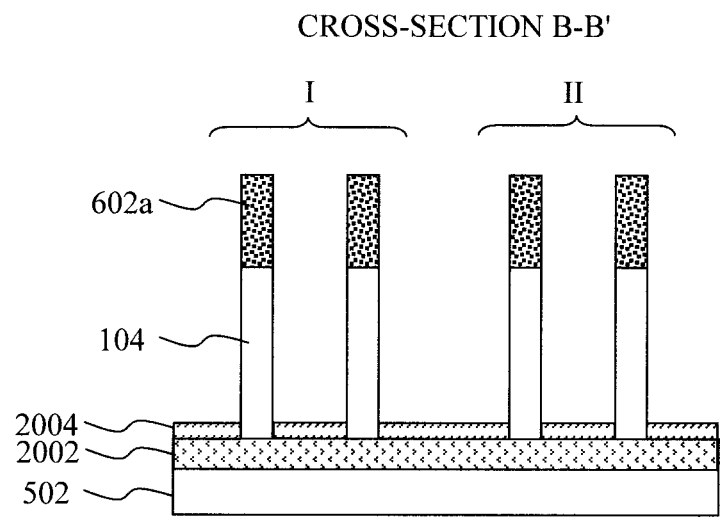
FIG. 20A is a cross-sectional diagram through the fins illustrating bottom source and drains having been formed in the substrate beneath the fins, and bottom spacers having been formed on the bottom source and drains according to an embodiment of the present invention.
Figure 20B:
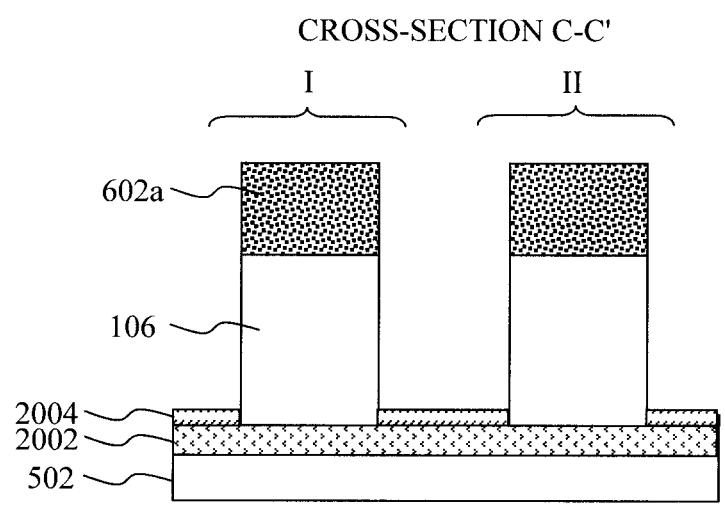
FIG. 20B is a cross-sectional diagram through the cross fins illustrating the bottom source and drains having been formed in the substrate beneath the cross fins, and the bottom spacers having been formed on the bottom source and drains according to an embodiment of the present invention.
Figure 21A:
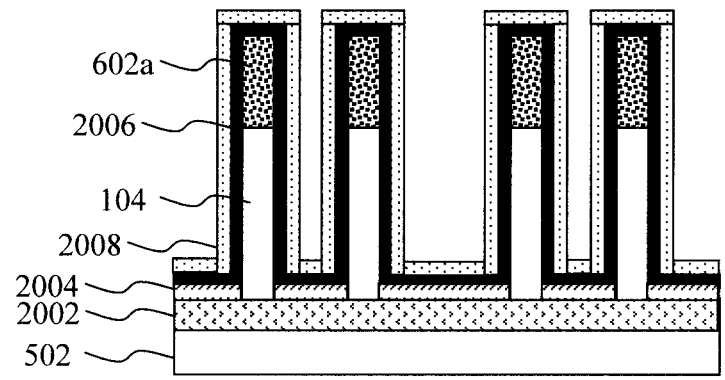
FIG. 21A is a cross-sectional diagram through the fins illustrating a conformal gate dielectric having been deposited onto the fins, and a conformal gate conductor having been deposited onto the gate dielectric according to an embodiment of the present invention.
Figure 21B:
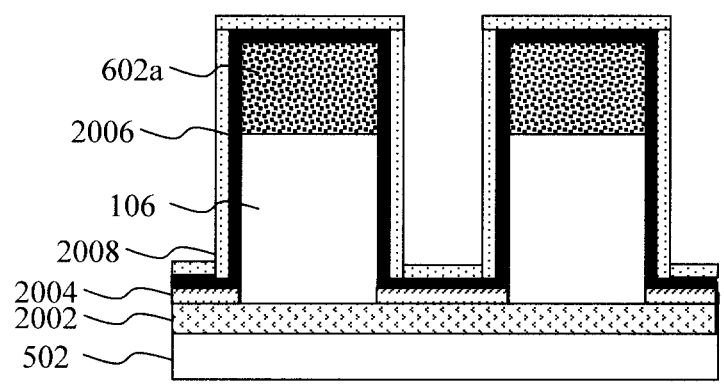
FIG. 21B is a cross-sectional diagram through the cross fins illustrating the conformal gate dielectric having been deposited onto the cross fins, and the conformal gate conductor having been deposited onto the gate dielectric according to an embodiment of the present invention.

As shown in FIG. 20A (cross-section B-B') and FIG. 20B (cross-section C-C'), based on the above-described fin patterning process there is at least one first set of adjacent fins 104 (fins I) and at least one second set of adjacent fins 104 (fins II) (see FIG. 20A) and at least one first cross fin 106 (cross fin I) and at least one second cross fin 106 (cross fin II) (see FIG. 20B), respectively, which have been patterned in the substrate 502. As will become apparent from the description that follows, the first set of adjacent fins 104 (fins I)/first cross fin 106 (cross fin I) will be used to form a first VFET device, and the second set of adjacent fins 104 (fins II)/second cross fin 106 (cross fin II) will be used to form a second VFET device. Each of the VFET devices formed will have a vertical fin channel formed from the two adjacent fins 104 (i.e., fins I or II) and at least one cross fin 106 (i.e., cross fins I or II).

Following patterning of the fins 104 and cross fins 106, bottom source and drains 2002 are next formed in the substrate 502 beneath the fins 104 (see FIG. 20A) and cross fins 106 (see FIG. 20B). According to an exemplary embodiment, the bottom source and drains 2002 are formed using ion implantation into the substrate 502, beneath the fins 104 and cross fins 106. Suitable n-type dopants include phosphorous (P) and/or arsenic (As), and suitable p-type dopants include, but are not limited to, boron (B). Ion implantation is only one technique anticipated herein for forming the bottom source and drains 2002. For instance, the bottom source and drains 2002 can also be formed by growing a doped epitaxial material (e.g., epitaxial silicon (Si), epitaxial germanium (Ge) and/or epitaxial silicon germanium (SiGe)) on the substrate 502 at the base of the fins 104 and cross fins 106.

To form functioning VFET devices, a gate will be formed around the fins 104 and cross fins 106, and top source and drains will be formed over the gate at the tops of the fins 104 and cross fins 106. Bottom and top spacers will be formed separating the gate from the bottom and top source and drains, respectively.

For instance, bottom spacers 2004 are formed on the bottom source and drains 2002, in between the fins 104 (see FIG. 20A) and the cross fins 106 (see FIG. 20B). According to an exemplary embodiment, the bottom spacers 2004 are formed using a directional deposition process whereby a spacer material is deposited onto the bottom source and drains 2002 and fins 104/cross fins 106 with a greater amount of the spacer material being deposited on horizontal surfaces, as compared to vertical surfaces. To use an illustrative example, a greater thickness of the spacer material will be deposited on top of the bottom source and drains 2002 than along the sidewalls of the fins 104/cross fins 106. Thus, when an etch is used on the spacer material, the timing of the etch needed to remove the spacer material from the vertical surfaces will leave the bottom spacers 2004 shown in FIGS. 20A and 20B on top of bottom source and drains 2002 since a greater amount of the spacer material was present on the bottom source and drains 2002 to begin with.

By way of example only, a high density plasma (HDP) chemical vapor deposition (CVD) or physical vapor deposition (PVD) process can be used for directional deposition of the spacer material, and an isotropic etch can be used to remove the (thinner) spacer material that gets deposited onto the vertical surfaces. Suitable materials for the bottom spacers 2004 include, but are not limited to, oxide spacer materials such as silicon dioxide ($SiO_2$) and/or silicon carbon oxide (SiCO), and nitride spacer materials such as silicon nitride (SiN), silicon boron carbon nitride (SiBCN), silicon oxycarbon nitride (SiOCN), and/or silicon carbon nitride (SiCN).

Next, a gate is formed around the fins 104 and cross fins 106 over the bottom spacers 2004. The gate includes a conformal gate dielectric 2006 that is deposited onto the fins 104 (see FIG. 21A) and the cross fins 106 (see FIG. 21B), and a conformal gate conductor 2008 that is deposited onto the gate dielectric 2006. According to an exemplary embodiment, the conformal gate conductor 2008 is a workfunction-setting metal, and the conformal gate dielectric 2006 is a high-κ gate dielectric.

The particular workfunction-setting metal employed can vary depending on whether an n-type or p-type transistor is desired. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and tungsten (W). TiN and TaN are relatively thick (e.g., greater than about 2 nanometers (nm)) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

The term "high-κ," as used herein, refers to a material having a relative dielectric constant κ which is much higher than that of silicon dioxide (e.g., a dielectric constant κ=25 for hafnium oxide ($HfO_2$) rather than 4 for silicon dioxide). Suitable high-κ gate dielectrics include, but are not limited to, $HfO_2$ and/or lanthanum oxide ($La_2O_3$).

As deposited, the gate dielectric 2006 and the gate conductor 2008 encapsulate the fins 104 and cross fins 106. However, access to the tops of the fins 104 and cross fins 106 is needed in order to form the top source and drains. Thus, the gate dielectric 2006 and the gate conductor 2008 need to be recessed at the tops of the fins 104 and cross fins 106.

Figure 22A:
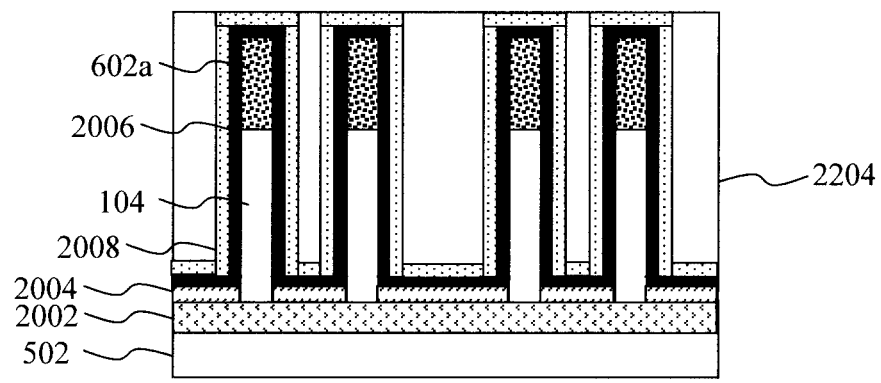
FIG. 22A is a cross-sectional diagram through the fins illustrating a gap fill dielectric having been deposited onto the gate conductor, burying the fins according to an embodiment of the present invention.
Figure 22B:
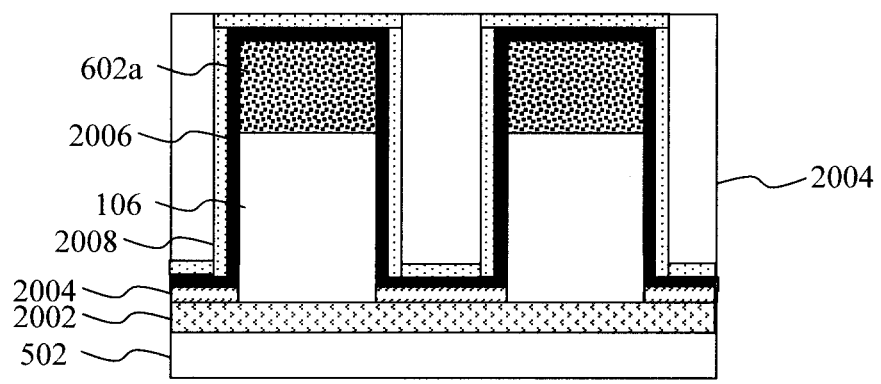
FIG. 22B is a cross-sectional diagram through the cross fins illustrating the gap fill dielectric having been deposited onto the gate conductor, burying the cross fins according to an embodiment of the present invention.
Figure 23A:
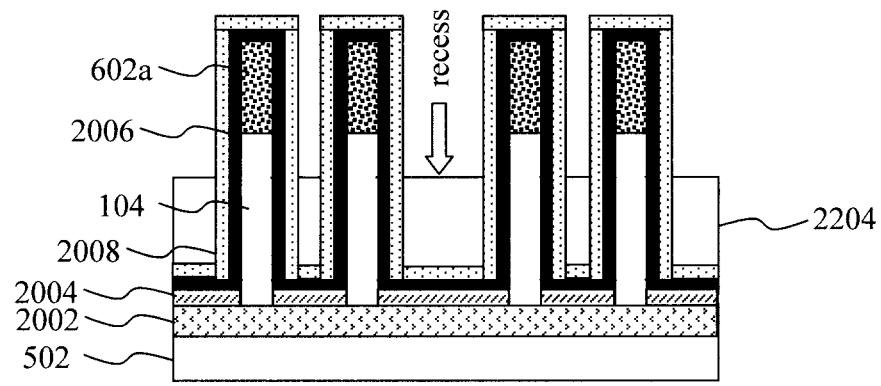
FIG. 23A is a cross-sectional diagram through the fins illustrating the gap fill dielectric having been recessed such that a top surface of the gap fill dielectric is below the tops of the fins according to an embodiment of the present invention.
Figure 23B:
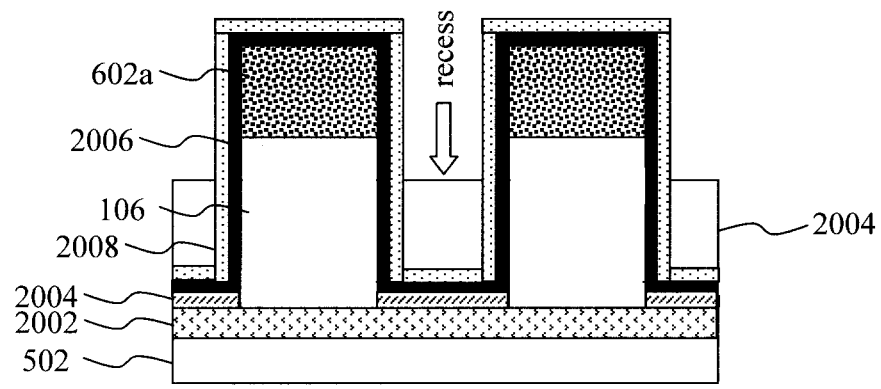
FIG. 23B is a cross-sectional diagram through the cross fins illustrating the gap fill dielectric having been recessed such that a top surface of the gap fill dielectric is below the tops of the cross fins according to an embodiment of the present invention.

To recess the gate dielectric 2006 and the gate conductor 2008, a gap fill dielectric 2204 such as an organic planarizing layer (OPL) is deposited onto the gate conductor 2008, burying fins 104 (see FIG. 22A) and the cross fins 106 (see FIG. 22B). Suitable OPL materials include, but are not limited to, aromatic cross-linkable polymers (e.g., naphthalene-based polymers). Other suitable organic planarizing materials are described, for example, in U.S. Pat. No. 7,037,994 issued to Sugita et al. entitled "Acenaphthylene Derivative, Polymer, and Antireflection Film-Forming Composition," U.S. Pat. No. 7,244,549 issued to Iwasawa et al.

entitled "Pattern Forming Method and Bilayer Film," U.S. Pat. No. 7,303,855 issued to Hatakeyama et al. entitled "Photoresist Undercoat-Forming Material and Patterning Process" and U.S. Pat. No. 7,358,025 issued to Hatakeyama entitled "Photoresist Undercoat-Forming Material and Patterning Process," the contents of each of which are incorporated by reference as if fully set forth herein. The gap fill dielectric 2204 fills in the spaces between the fins 104/cross fins 106. After deposition, the gap fill dielectric 2204 is polished down to the gate conductor 2008 using a process such as chemical mechanical polishing (CMP).

The use of gap fill dielectric 2204 allows for the selective exposure of the tops of the fins 104/cross fins 106. Namely, the gap fill dielectric 2204 is next recessed such that the top surface of the gap fill dielectric 2204 is below the tops of the fins 104 (see FIG. 23A) and the cross fins 106 (see FIG. 23B). This recess of the gap fill dielectric 2204 sets the depth for the subsequent recess of the gate dielectric 2006 and the gate conductor 2008.

Figure 24A:
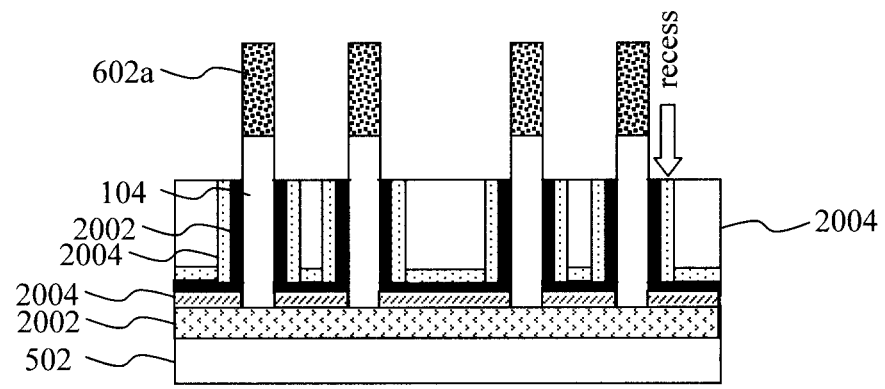
FIG. 24A is a cross-sectional diagram through the fins illustrating the gate dielectric and the gate conductor having been recessed down to the (recessed) gap fill dielectric, exposing the tops of the fins according to an embodiment of the present invention.
Figure 24B:
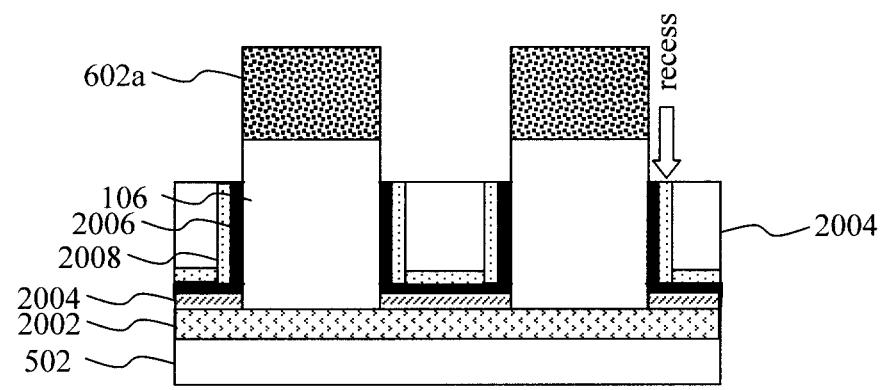
FIG. 24B is a cross-sectional diagram through the cross fins illustrating the gate dielectric and the gate conductor having been recessed down to the (recessed) gap fill dielectric, exposing the tops of the cross fins according to an embodiment of the present invention.
Figure 25A:
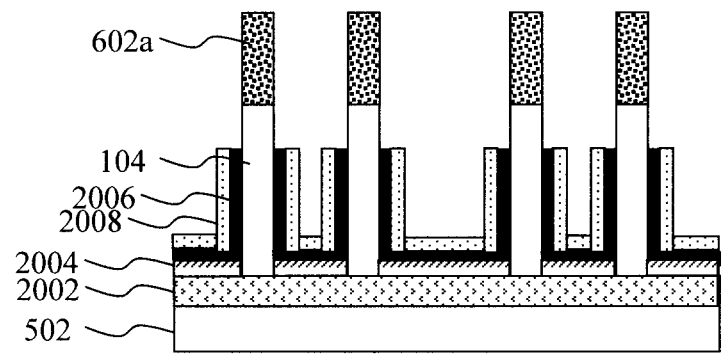
FIG. 25A is a cross-sectional diagram through the fins illustrating the gap fill dielectric having been removed according to an embodiment of the present invention.
Figure 25B:
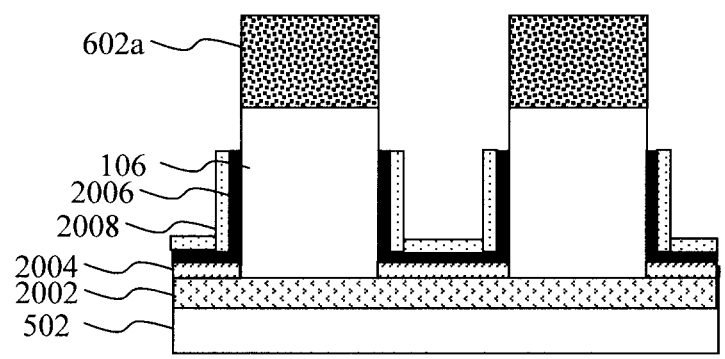
FIG. 25B is a cross-sectional diagram through the cross fins illustrating the gap fill dielectric having been removed according to an embodiment of the present invention.

For instance, the gate dielectric 2006 and the gate conductor 2008 are then recessed down to the (recessed) gap fill dielectric 2204, exposing the tops of the fins 104 (see FIG. 24A) and the cross fins 106 (see FIG. 24B). Following recess of the gate dielectric 2006 and the gate conductor 2008, the gap fill dielectric 2204 is removed. See FIGS. 25A and 25B.

Figure 26A:
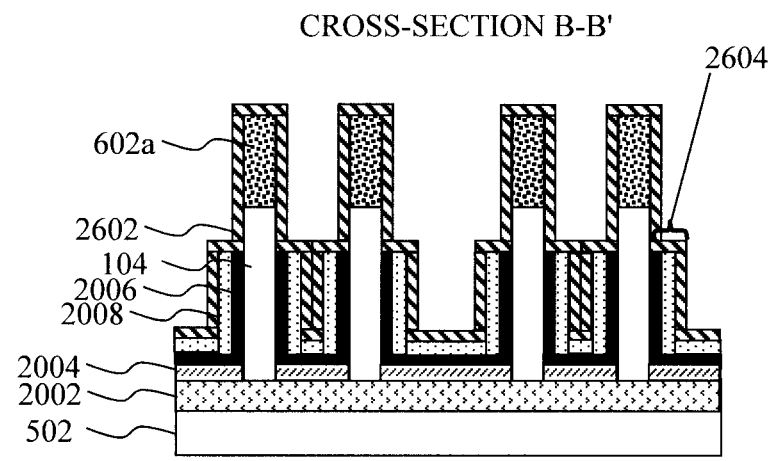
FIG. 26A is a cross-sectional diagram through the fins illustrating a conformal encapsulation layer having been formed on the gate conductor and over the fins according to an embodiment of the present invention.
Figure 26B:
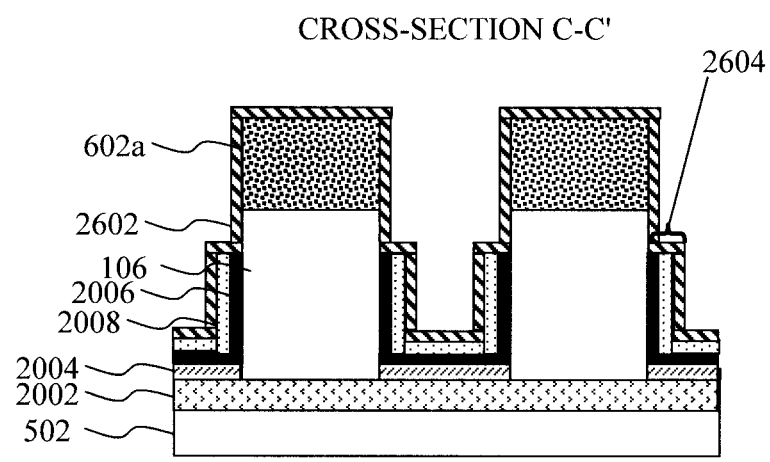
FIG. 26B is a cross-sectional diagram through the cross fins illustrating a conformal encapsulation layer having been formed on the gate conductor and over the cross fins according to an embodiment of the present invention.

As provided above, top spacers are needed above the gate, separating the gate from the top source and drains. To form the top spacers, a conformal encapsulation layer 2602 is formed on the gate conductor 2008 and over the fins 104 (see FIG. 26A) and the cross fins 106 (see FIG. 26B). As shown in FIGS. 26A and 26B, formation of the encapsulation layer 2602 provides top spacers 2604 over the gate. The top spacers 2604 and their counterpart bottom spacers 2004 serve to offset the gate from the top and bottom source and drains, respectively. Suitable materials for the encapsulation layer 2602 (and thus top spacers 2604) include, but are not limited to, nitride materials such as silicon nitride (SiN) and/or silicon-boron-nitride (SiBN).

Figure 27A:
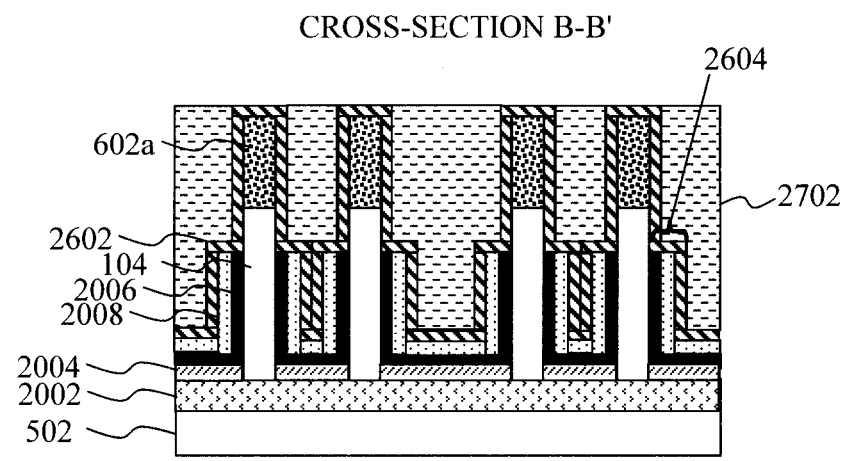
FIG. 27A is a cross-sectional diagram through the fins illustrating an interlayer dielectric (ILD) having been deposited over the encapsulation layer, filling spaces in between the fins according to an embodiment of the present invention.
Figure 27B:
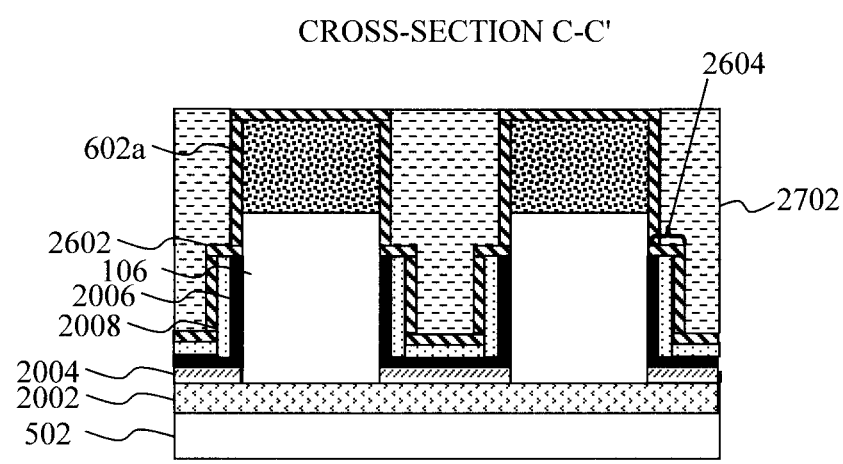
FIG. 27B is a cross-sectional diagram through the cross fins illustrating the ILD having been deposited over the encapsulation layer, filling spaces in between the cross fins according to an embodiment of the present invention.
Figure 28A:
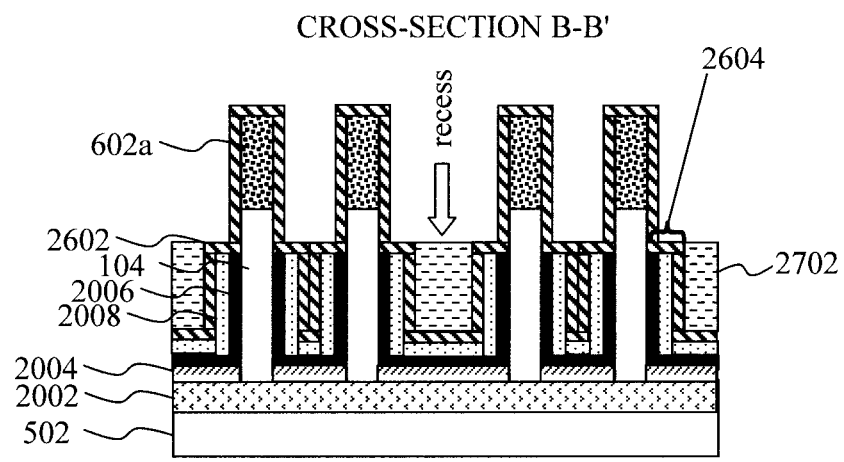
FIG. 28A is a cross-sectional diagram through the fins illustrating the ILD having been recessed such that a top surface of the ILD is beneath the tops of the fins according to an embodiment of the present invention.
Figure 28B:
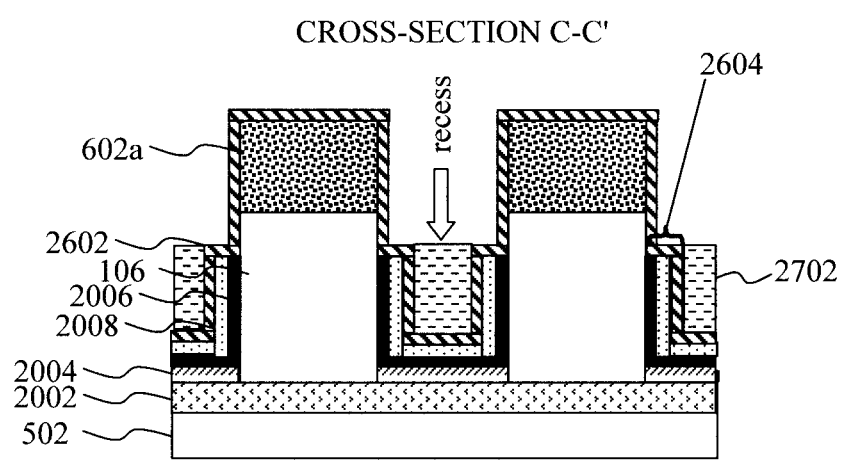
FIG. 28B is a cross-sectional diagram through the cross fins illustrating the ILD having been recessed such that the top surface of the ILD is beneath the tops of the cross fins according to an embodiment of the present invention.

An interlayer dielectric (ILD) 2702 is then blanket deposited over the encapsulation layer 2602, filling the spaces in between the fins 104 (see FIG. 27A) and the cross fins 106 (see FIG. 27B). Suitable ILD materials include, but are not limited to, silicon dioxide ($SiO_2$). Use of ILD 2702 enables removal of the fin hardmasks 104 and encapsulation layer 2602 at the tops of the fins 104/cross fins 106. Specifically, the ILD 1702 is then recessed such that the top surface of the ILD 2702 is beneath the tops of the fins 104 (see FIG. 28A) and the cross fins 106 (see FIG. 28B).

Figure 29A:
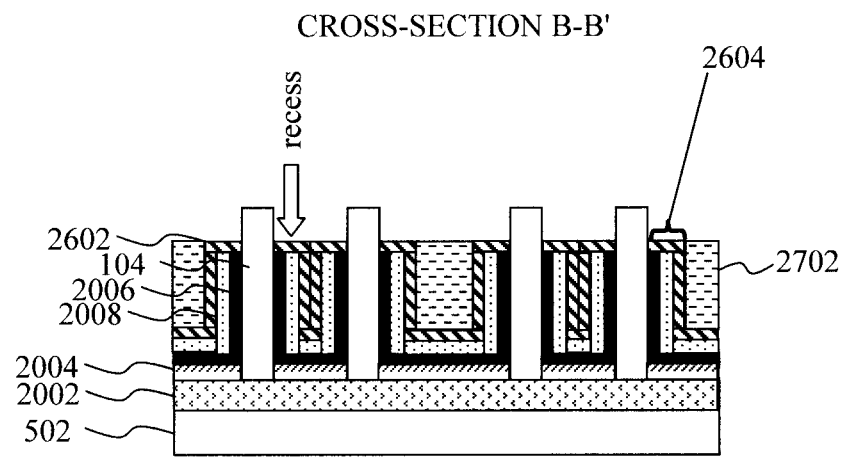
FIG. 29A is a cross-sectional diagram through the fins illustrating an etch having been used to remove the encapsulation layer and the fin hardmasks at the tops of the fins according to an embodiment of the present invention.
Figure 29B:
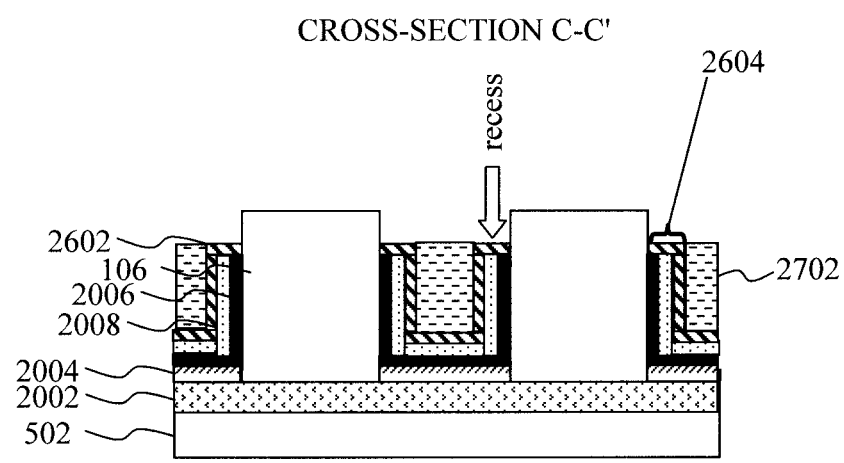
FIG. 29B is a cross-sectional diagram through the cross fins illustrating an etch having been used to remove the encapsulation layer and the fin hardmasks at the tops of the cross fins according to an embodiment of the present invention.

An etch is then used to remove the encapsulation layer 2602 and the fin hardmasks 602a at the tops of the fins 104 (see FIG. 29A) and the cross fins 106 (see FIG. 29B). This recess etch reveals the tops of the fins 104 and cross fins 106 to permit formation of the top source and drain. As provided above, the fins hardmasks 602a and the encapsulation layer 2602 can both be formed from a nitride material. In that case, a nitride-selective etching process, such as a nitride-selective RIE can be employed to recess the encapsulation layer 2602 (i.e., down to the ILD 2702) and remove the fin hardmasks 602a. It is notable that, following the recess etch of the encapsulation layer 2602, the top spacers 2604 remain present over the gate.

Figure 30A:
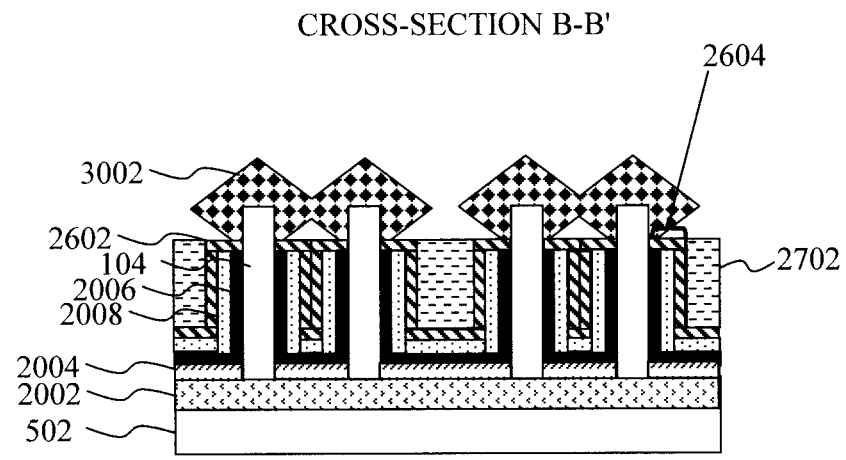
FIG. 30A is a cross-sectional diagram through the fins illustrating top source and drains having been formed on the tops of the fins according to an embodiment of the present invention.
Figure 30B:
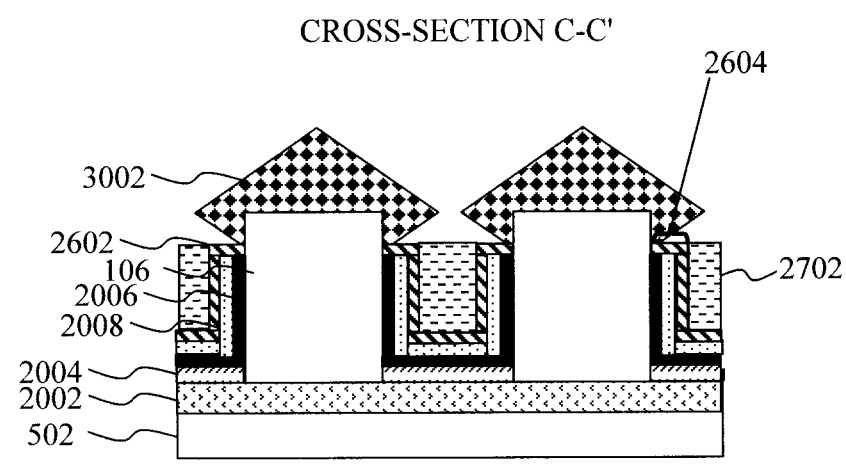
FIG. 30B is a cross-sectional diagram through the cross fins illustrating top source and drains having been formed on the tops of the cross fins according to an embodiment of the present invention.

Top source and drains 3002 are then formed on the (now exposed) tops of the fins 104 (see FIG. 30A) and the cross fins 106 (see FIG. 30B). According to an exemplary embodiment, the top source and drains 3002 are formed from an in-situ (i.e., during growth) or ex-situ (e.g., via implantation) doped epitaxial material such as epitaxial Si, Ge, SiGe, etc.

As provided above, suitable n-type dopants include, but are not limited to, phosphorous (P) and arsenic (As), and suitable p-type dopants include, but are not limited to, boron (B).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a fin structure for a vertical field effect transistor (VFET), the method comprising the steps of:
   depositing a hardmask onto a substrate;
   depositing a mandrel material onto the hardmask;
   patterning the mandrel material along a first direction to form first mandrels;
   forming first spacers alongside the first mandrels;
   filling gaps between the first mandrels with additional mandrel material to form second mandrels in between the first mandrels;
   patterning the first mandrels, the first spacers and the second mandrels along a second direction, wherein the second direction is perpendicular to the first direction;
   forming second spacers, perpendicular to the first spacers, alongside the first mandrels and the second mandrels;
   selectively removing the first mandrels and the second mandrels leaving behind a ladder-shaped pattern formed by the first spacers and the second spacers;
   transferring the ladder-shaped pattern to the hardmask; and
   transferring the ladder-shaped pattern from the hardmask to the substrate to form a first fin adjacent to a second fin, and at least one cross fin interconnecting the first fin and the second fin; and
   cutting the ladder-shaped pattern in the substrate into individual fin structures, wherein cuts made during the cutting are located to form each individual fin structure comprising: a first cross fin interconnecting the first fin and the second fin at one end of the individual fin structure, and a second cross fin interconnecting the first fin and the second fin at another end of the individual fin structure in an O-shaped fin structure.

2. The method of claim 1, wherein the first mandrels and the second mandrels both comprise a material selected from the group consisting of: amorphous silicon, amorphous carbon, and combinations thereof.

3. The method of claim 1, wherein the first spacers and the second spacers both comprise silicon dioxide.

4. The method of claim 1, wherein the at least one cross fin is oriented orthogonal to the first fin and the second fin and interconnects the first fin and the second fin at a center of the first fin and the second fin in an H-shaped fin structure.

5. The method of claim 1, wherein the ladder-shaped pattern in the substrate comprises multiple cross fins interconnecting the first fin and the second fin.

6. A method of forming a VFET device, the method comprising the steps of:
   forming a fin structure in a substrate, the fin structure comprising a first fin adjacent to a second fin, and at least one cross fin interconnecting the first fin and the second fin;
   forming bottom source and drains in the substrate beneath the fin structure;

forming bottom spacers on the bottom source and drains;
forming a gate around the fin structure over the bottom spacers;
forming top spacers above the gate; and
forming top source and drains at a top of the fin structure.

7. The method of claim 6, wherein the step of forming the fin structure comprises the steps of:
depositing a hardmask onto a substrate;
depositing a mandrel material onto the hardmask;
patterning the mandrel material along a first direction to form first mandrels;
forming first spacers alongside the first mandrels;
filling gaps between the first mandrels with additional mandrel material to form second mandrels in between the first mandrels;
patterning the first mandrels, the first spacers and the second mandrels along a second direction, wherein the second direction is perpendicular to the first direction;
forming second spacers, perpendicular to the first spacers, alongside the first mandrels and the second mandrels;
selectively removing the first mandrels and the second mandrels leaving behind a ladder-shaped pattern formed by the first spacers and the second spacers;
transferring the ladder-shaped pattern to the hardmask; and
transferring the ladder-shaped pattern from the hardmask to the substrate to form the fin structure.

8. The method of claim 7, wherein the first mandrels and the second mandrels both comprise a material selected from the group consisting of: amorphous silicon, amorphous carbon, and combinations thereof.

9. The method of claim 7, wherein the first spacers and the second spacers both comprise silicon dioxide.

10. The method of claim 6, wherein the at least one cross fin is oriented orthogonal to the first fin and the second fin and interconnects the first fin and the second fin at a center of the first fin and the second fin in an H-shaped fin structure.

11. The method of claim 6, wherein the fin structure comprises multiple cross fins.

12. The method of claim 11, wherein a first cross fin interconnects the first fin and the second fin at one end of the first fin and the second fin, and wherein a second cross fin interconnects the first fin and the second fin at another end of the first fin and the second fin in an O-shaped fin structure.

13. The method of claim 6, wherein the step of forming the gate comprises:
depositing a gate dielectric around the fin structure; and
depositing a gate conductor on the gate dielectric.

14. The method of claim 13, wherein the gate dielectric comprises a high-κ gate dielectric selected from the group consisting of: hafnium oxide, lanthanum oxide, and combinations thereof.

15. The method of claim 13, wherein the gate conductor comprises a workfunction-setting metal selected from the group consisting of: titanium nitride, tantalum nitride, aluminum-containing alloys, titanium aluminide, titanium aluminum nitride, titanium aluminum carbide, tantalum aluminide, tantalum aluminum nitride, tantalum aluminum carbide, tungsten, and combinations thereof.

16. A VFET fin structure, comprising:
a first fin adjacent to a second fin; and
at least one cross fin interconnecting the first fin and the second fin, wherein the at least one cross fin is oriented at an angle θ<90° relative to the first fin and the second fin, and wherein the at least one cross fin interconnects the first fin and the second fin in an N-shaped fin structure.

17. The VFET fin structure of claim 16, wherein the VFET fin structure comprises multiple cross fins interconnecting the first fin and the second fin.

18. The VFET fin structure of claim 16, wherein the fin structure comprises a first cross fin interconnecting the first fin and the second fin at one end of the first fin and the second fin, and a second cross fin interconnecting the first fin and the second fin at another end of the first fin and the second fin in an O-shaped fin structure.

19. A VFET device, comprising:
a fin structure patterned in a substrate, the fin structure comprising a first fin adjacent to a second fin, and at least one cross fin interconnecting the first fin and the second fin;
bottom source and drains in the substrate beneath the fin structure;
bottom spacers disposed on the bottom source and drains;
a gate surrounding the fin structure over the bottom spacers;
top spacers disposed above the gate; and
top source and drains at a top of the fin structure.

20. The VFET device of claim 19, wherein the at least one cross fin is oriented orthogonal to the first fin and the second fin and interconnects the first fin and the second fin at a center of the first fin and the second fin in an H-shaped fin structure.

* * * * *